(12) United States Patent
Hirai

(10) Patent No.: US 8,264,286 B2
(45) Date of Patent: Sep. 11, 2012

(54) PHASE-LOCKED LOOP CIRCUIT

(75) Inventor: Yoshitaka Hirai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 73 days.

(21) Appl. No.: 12/461,931

(22) Filed: Aug. 28, 2009

(65) Prior Publication Data

US 2010/0052798 A1    Mar. 4, 2010

(30) Foreign Application Priority Data

Sep. 2, 2008   (JP) ................................. 2008-224442

(51) Int. Cl.
*H03L 7/00* (2006.01)
(52) U.S. Cl. .............. 331/16; 331/57; 331/34; 331/179; 331/177 R; 331/DIG. 2
(58) Field of Classification Search .................... 331/16, 331/34, 57, 179
See application file for complete search history.

(56) References Cited

U.S. PATENT DOCUMENTS

| | | | | |
|---|---|---|---|---|
| 7,148,757 B2* | 12/2006 | Chiu | ............................... | 331/16 |
| 7,639,087 B2* | 12/2009 | Tung | ............................... | 331/16 |
| 2008/0174349 A1* | 7/2008 | Luo et al. | ....................... | 327/157 |

FOREIGN PATENT DOCUMENTS

| | | |
|---|---|---|
| JP | 09-191247 | 7/1997 |
| WO | WO 99/19987 | 4/1999 |

* cited by examiner

*Primary Examiner* — Aronld Kinkead
(74) *Attorney, Agent, or Firm* — Foley & Lardner LLP

(57) ABSTRACT

A first exemplary aspect of an embodiment of the present invention is a phase-locked loop circuit including: a voltage-current converter that converts a control voltage into a control current, the control voltage generated according to a phase difference between an input pulse signal and a feedback pulse signal fed back from an output side of a current controlled oscillator; the current controlled oscillator that generates an output pulse signal having a frequency according to the control current; a current detection unit that detects the control current; and a frequency range switch that switches a frequency range of the output pulse signal according to the detected control current.

9 Claims, 10 Drawing Sheets

PHASE-LOCKED LOOP CIRCUIT

BACKGROUND

1. Field of the Invention

The present invention relates to a phase-locked loop circuit.

2. Description of Related Art

A PLL (phase-locked loop) circuit is one of the most popular clock generating circuits. FIG. 7 shows a PLL circuit disclosed in FIG. 1 of International Patent Publication No. WO 99/19987. This PLL circuit includes a phase frequency detector (PFD) 14, a loop filter 18, a voltage controlled oscillator (VCO) 20, a clock divider 22, a decision circuit 30, and a control unit 32. In this PLL circuit, an input signal is input to the PFD 14. The PFD 14 generates a signal based on both the input signal and a feedback signal from an output side of the VCO 20, and outputs the generated signal to the loop filter 18. Then, the VCO 20 outputs the output signal based on a control voltage which is output from the loop filter 18. The output signal is fed back to the PFD 14 through clock divider 22.

Further, the decision circuit 30 detects the control voltage in this PLL circuit shown in FIG. 7. Based on a decision of the decision circuit 30, the control unit 32 decides a dividing ratio of the clock divider 22. A similar art is disclosed in Japanese Unexamined Patent Application Publication No. 09-191247.

SUMMARY

In general, the VCO has a voltage-current converter (VIC) which converts a control voltage to a control current and a current controlled oscillator (CCO). Here, converting property of the VIC is easily influenced by several factors such as manufacturing conditions of the VIC and operating temperature environment of the VIC, and varies widely. Therefore, the frequency of the output signal cannot be identified with a high degree of accuracy even when the control voltage is detected. Thus, the dividing ratio of the clock divider cannot be set with a high degree of accuracy in International Patent Publication No. WO 99/19987 and Japanese Unexamined Patent Application Publication No. 09-191247.

A first exemplary aspect of an embodiment of the present invention is a phase-locked loop circuit including: a voltage-current converter that converts a control voltage into a control current, the control voltage generated according to a phase difference between an input pulse signal and a feedback pulse signal fed back from an output side of a current controlled oscillator; the current controlled oscillator that generates an output pulse signal having a frequency according to the control current; a current detection unit that detects the control current; and a frequency range switch that switches a frequency range of the output pulse signal according to the detected control current.

According to an exemplary embodiment of the present invention, the frequency of the output pulse signal can be accurately known by detecting the control current. Therefore, the frequency range of the output pulse signal can be accurately switched. Thus, the output frequency range can be extended.

According to an exemplary embodiment of the present invention, it is possible to provide a phase-locked loop circuit having wide output frequency range.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
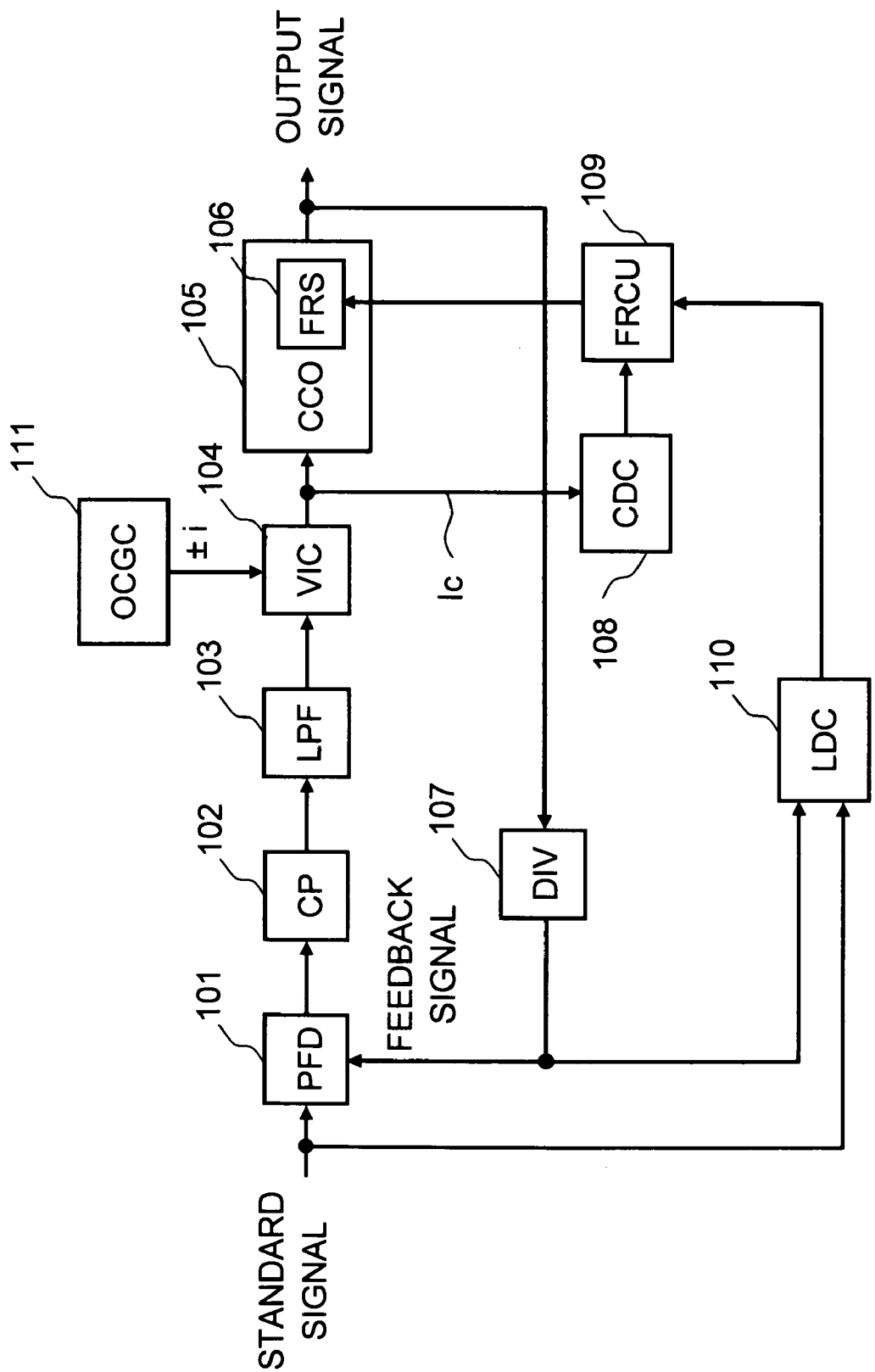
FIG. 1 is a block diagram showing a PLL circuit according to a first exemplary embodiment of the present invention.

Exemplary embodiments of the present invention will be described below with reference to the accompanying drawings. FIG. 1 is a block diagram showing a PLL circuit according to a first exemplary embodiment of the present invention. As shown in FIG. 1, the PLL circuit according to the first exemplary embodiment includes a phase frequency detector (PFD) 101, a charge pump (CP) 102, a low pass filter (LPF) 103, a voltage-current converter (VIC) 104, a current controlled oscillator (CCO) 105, a frequency range switch (FRS) 106, a frequency divider (DIV) 107, a current decision circuit 108, a frequency range control unit 109, a lock detection circuit 110, and an offset current generation circuit 111.

The PFD 101 compares a phase of a feedback signal from an output side with a phase of a standard signal. When the feedback signal has a phase delayed compared to that of the standard signal, the PFD 101 outputs an UP signal to increase an oscillation frequency to the charge pump 102. On the other hand, when the feedback signal has a phase advanced compared to that of the standard signal, the PFD 101 outputs a DOWN signal to decrease an oscillation frequency to the charge pump 102. In the first exemplary embodiment, a unique standard signal is input into the PLL circuit.

The CP 102 converts an UP signal or a DOWN signal from the PFD 101 into a current. This current is input into the LPF 103. The LPF 103 converts the current generated by the CP 102 into a control voltage. This control voltage is input into the VIC 104. The VIC 104 converts the control voltage into a current. Further, the VIC 104 generates a control current Ic by adding an offset current ±i which is generated by the offset current generation circuit 111 to this converted current. The control current Ic is input into the CCO 105 and the current decision circuit 108.

The CCO 105 generates and outputs an output signal having a frequency according to the control current Ic. Here, the CCO 105 includes the FRS 106. A frequency range of the output signal is switched by the FRS 106. Therefore, the frequency range of the output signal can be extended. In the first exemplary embodiment of the present invention, the FRS 106 is a frequency divider. The frequency divider includes a single flip-flop or a plurality of flip-flops. The mechanism of extension of frequency ranges is described in more detail below.

The DIV 107 divides the output signal frequency. Then, the signal having the divided frequency is fed back to the PFD 101 as a feedback signal. Here, according to the dividing ratio of the DIV 107, the multiplying ratio of the PLL circuit is determined. In this regard, DIV 107 is not essential. On the other hand, a frequency divider which divides the frequency of the standard signal can be provided.

The current decision circuit 108 determines the level of input control current Ic. The results of determining the level of the control current Ic are input into the frequency range control unit 109.

The lock detection circuit 110 determines whether or not the phase is locked according to the standard signal and the feedback signal. Specifically, a phase-locked state is detected by comparing the count value of the standard signal and the count value of the feedback signal. For example, the lock detection circuit 110 outputs 1 (High) when the phase is locked. On the other hand, the lock detection circuit 110 outputs 0 (Low) when the phase is not locked. The digital signal output from the lock detection circuit 110 is input into the frequency range control unit 109. The lock detection circuit disclosed in Japanese Unexamined Patent Application Publication No. 2002-314409 by the inventor is suitable as lock detection circuit 110.

The frequency range control unit 109 outputs a control signal into the FRS 106 according to the results of determining the level of the control current Ic and the results of detecting the phase-locked state. Based on this control signal, the optimum frequency range is selected in the FRS 106. In the first exemplary embodiment, the dividing ratio of the FRS 106 is determined based on the control signal.

Figure 2:
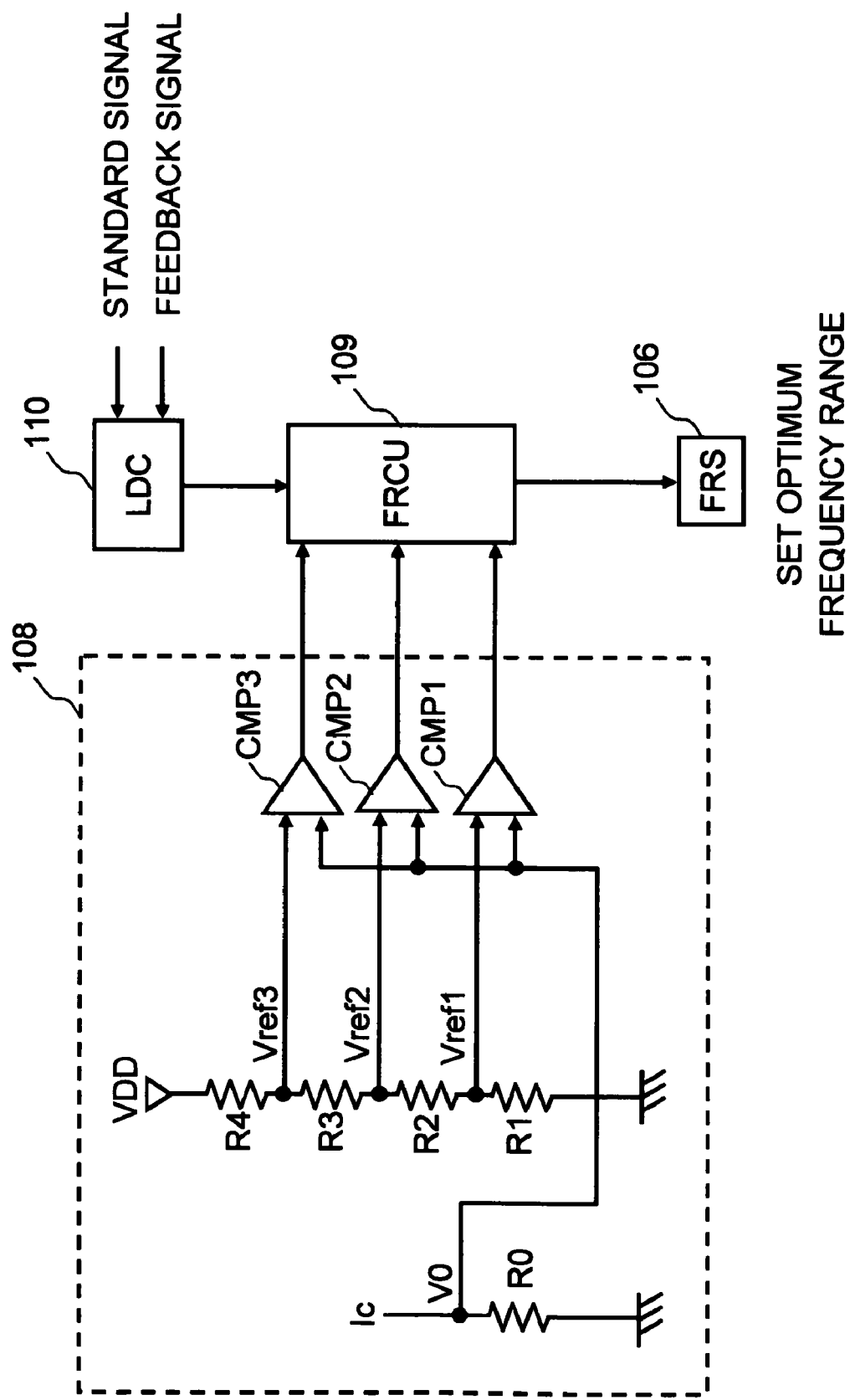
FIG. 2 is a circuit diagram showing one example of a current decision circuit 108.

FIG. 2 is a circuit diagram showing one example of the current decision circuit 108. The current decision circuit 108 includes comparators CMP1 to CMP3, voltage division resistance elements R1 to R4, and a control voltage generation resistance element R0. A control voltage V0 is generated based on the control current Ic by using the control voltage generation resistance element R0. The control voltage V0 is input into one of two input terminals of each comparator CMP1 to CMP3. Voltage division resistance elements R1 to R4 are connected in series in order between a power supply (VDD) and ground. Thus three reference voltages Vref1 to Vref3 are generated.

Specifically, the reference voltage Vref1 is generated in the node between the voltage division resistance elements R1 and R2. The reference voltage Vref2 is generated in the node between the voltage division resistance elements R2 and R3. The reference voltage Vref3 is generated in the node between the voltage division resistance elements R3 and R4. The reference voltage Vref1 is input into the other one of two input terminals of the comparator CMP1. In the same way, the reference voltage Vref2 is input into the other one of two input terminals of the comparator CMP2. The reference voltage Vref3 is input into the other one of two input terminals of the comparator CMP3.

According to such a configuration, the control voltage V0 is divided into four stages corresponding to V0<Vref1, Vref1<V0<Vref2, Vref2<V0<Vref3, and Vref3<V0. Specifically, the control current Ic is judged by four current ranges.

For example, each comparator CMP1 to CMP3 outputs 1 (High) when the control voltage V0 is the same as or higher than each reference voltage Vref1 to Vref3. On the other hand, each comparator CMP1 to CMP3 outputs 0 (Low) when the control voltage V0 is lower than each reference voltage Vref1 to Vref3. Each current range is represented by combination of digital signals output from CMP1 to CMP3 (output of CMP1, output of CMP2, output of CMP3). In the case of FIG. 2, for example, (000) represents current range 0, (100) represents current range 1, (110) represents current range 2, and (111) represents current range 3 from lower current range side. In this way, the combination of digital signals representing each current range is input into the frequency range control unit 109. Needless to say, the number of current ranges can be changed arbitrarily.

Figure 3:
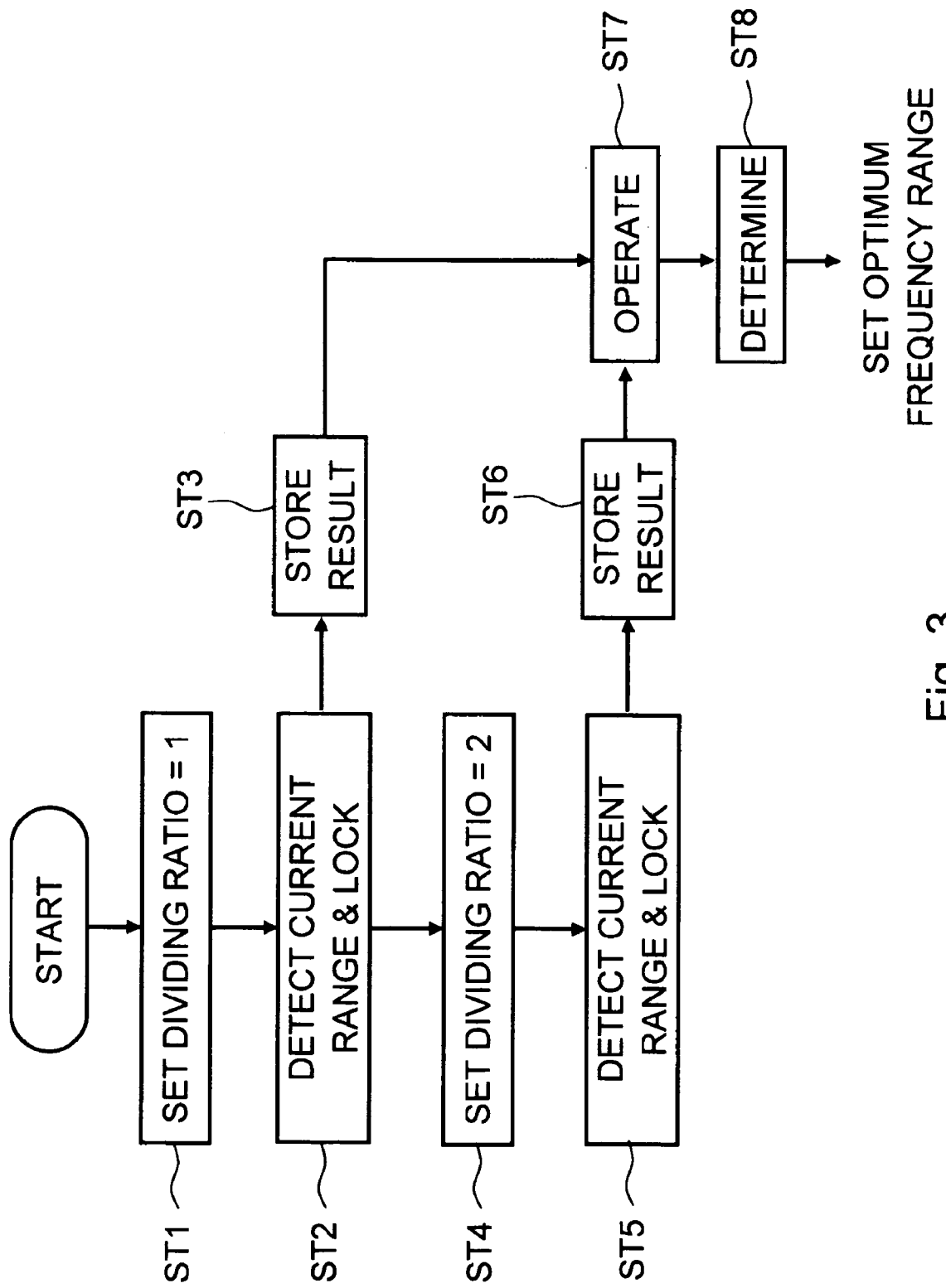
FIG. 3 is a flowchart showing a method of switching the frequency range according to the first exemplary embodiment of the present invention.

Referring next to FIG. 3, a description is given of a method of switching the frequency range of the CCO 105. In the first exemplary embodiment of the present invention, the dividing ratio of the frequency divider which is the FRS 106 is 1 or 2. In this regard, the value and number of the dividing ratios can be changed arbitrarily. For example, 1, 2, 4, and 8 can be selected. Further, 5 and 10 can be selected. Furthermore, the dividing ratio can include fractional numbers such as 1, 1.25, 1.5, 1.75, and 2.

First, the frequency range control unit 109 fixes the dividing ratio of the FRS 106 to 1 (ST1). Then, the lock detection circuit 110 performs lock detection, and the current decision circuit 108 determines the current range of the control current Ic (ST2). The results of lock detection and the current range are stored in a memory which is not illustrated in the drawings (ST3).

Next, the frequency range control unit 109 fixes the dividing ratio of the FRS 106 to 2 (ST4). Then, the lock detection circuit 110 performs lock detection, and the current decision circuit 108 determines the current range of the control current Ic (ST5). The results of lock detection and the current range are stored in a memory which is not illustrated in the drawings (ST6).

The frequency range control unit 109 operates according to the results of lock detection and the current ranges when the dividing ratio is 1 and 2 which are stored in the memory (ST7). Finally, the frequency range control unit 109 determines the optimum frequency range according to the operation results (ST8).

Figure 4:
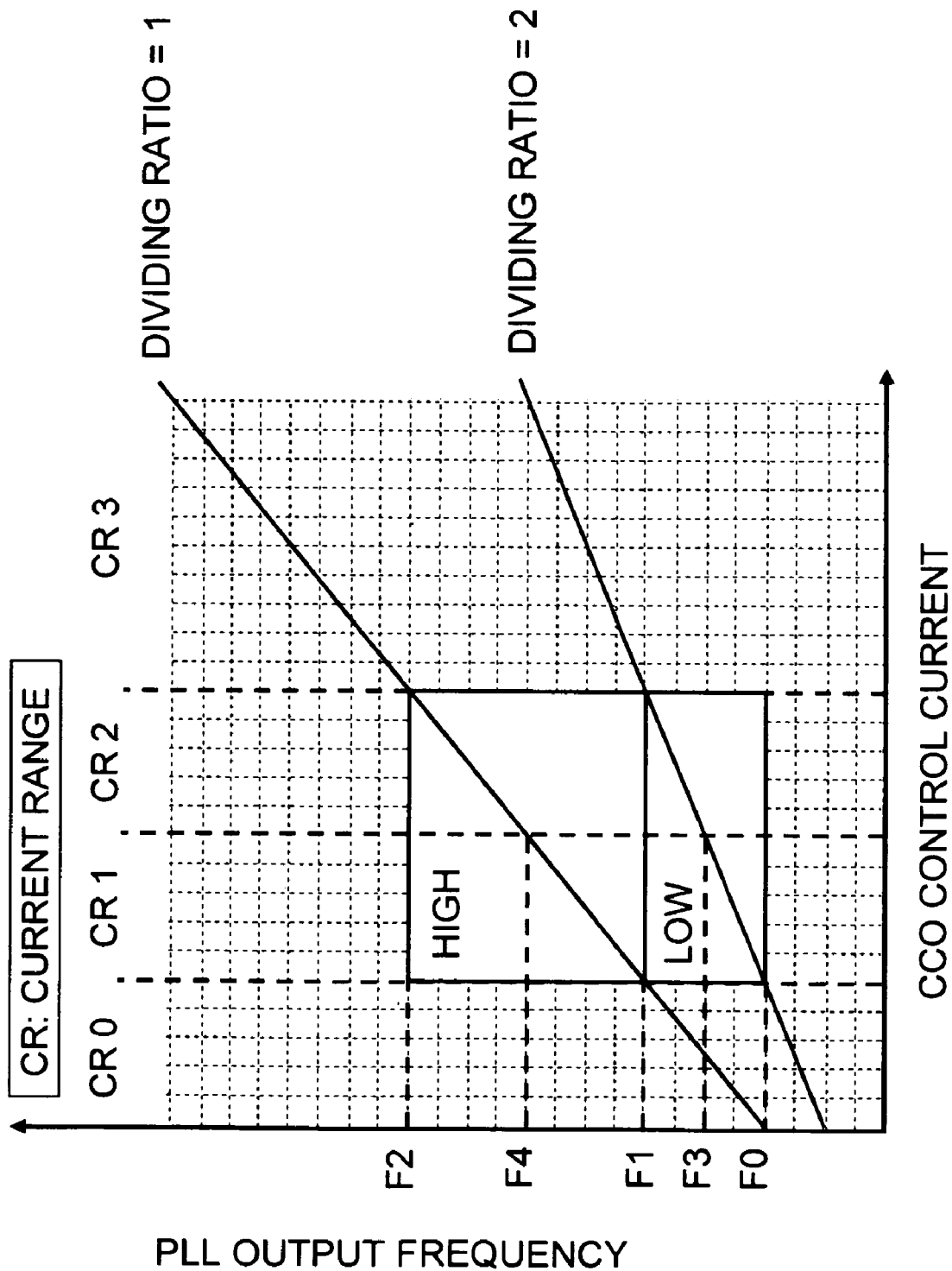
FIG. 4 is an explanatory diagram for a method of deciding the optimum frequency range.
Figure 5B:
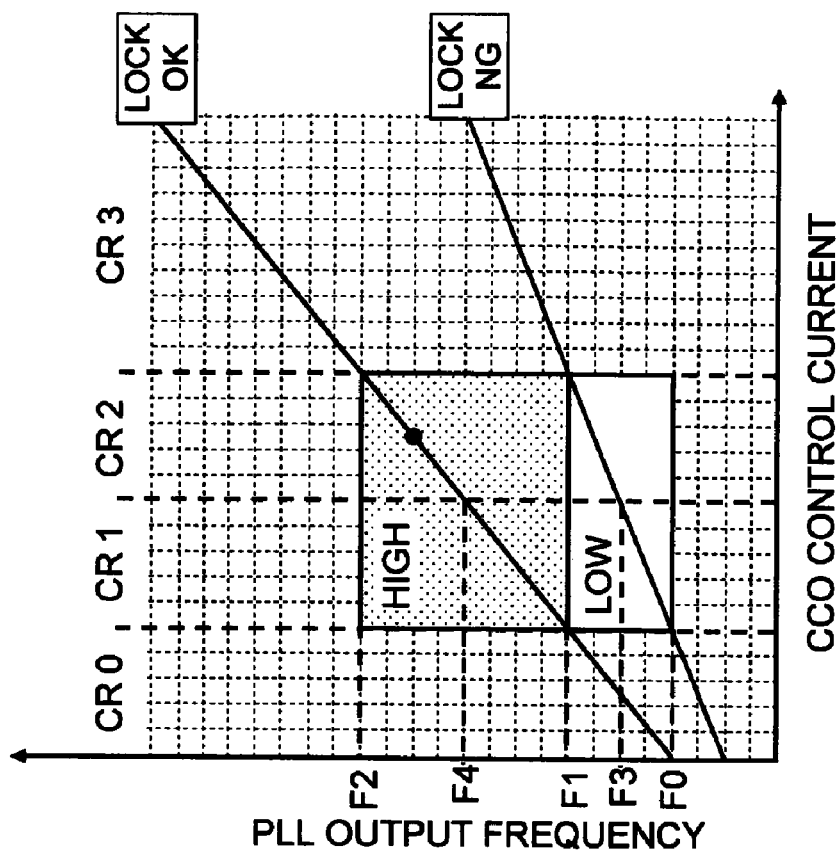
FIGS. 5A to 5G are explanatory diagrams for the method of deciding the optimum frequency range.
Figure 5A:
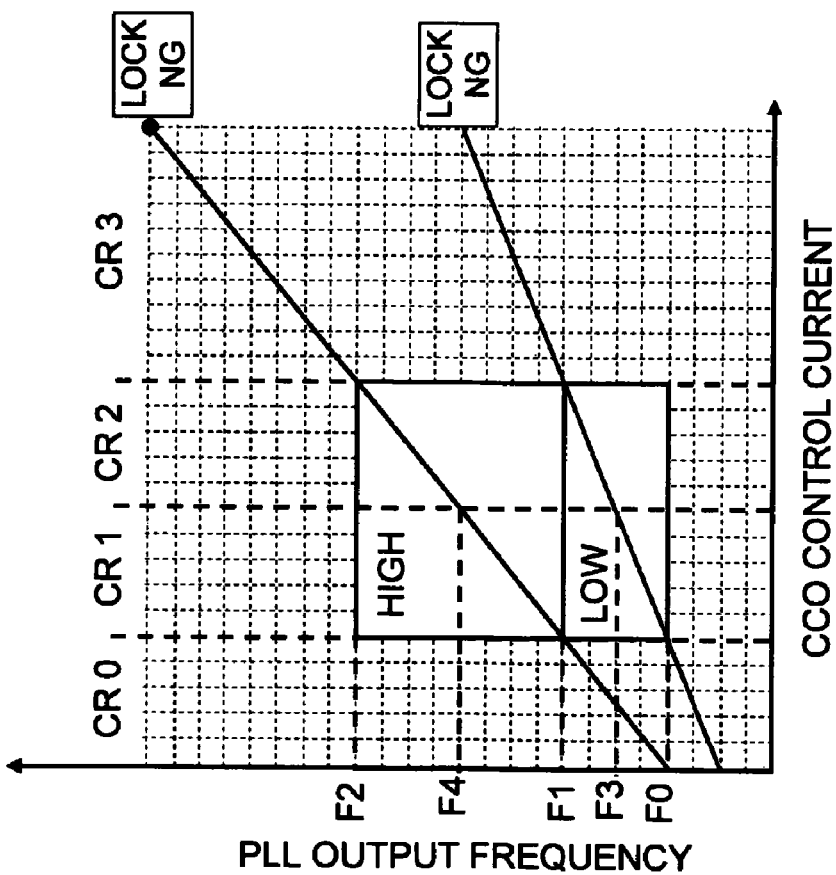

Referring next to FIGS. 4 and 5A to 5G, a description is given of a method of determining the optimum frequency range. While the horizontal axis of the graph shown in FIG. 4 represents the control current Ic of the CCO 105, the vertical axis represents the output frequency. When the dividing ratio is 1, the output frequency which can be locked is F1 to F2. The frequency range corresponding to F1 to F2 is a HIGH range. On the other hand, when the dividing ratio is 2, the output frequency which can be locked is F0 to F1. The frequency range corresponding to F0 to F1 is a LOW range. Here, the frequency F3 is positioned in the center between the frequency F0 and the frequency F1. The frequency F4 is positioned in the center between the frequency F1 and the frequency F2. FIG. 5A shows the case that the output frequency is higher than F2. In this case, the control current Ic of the CCO 105 belongs to the current range 3 regardless of whether the dividing ratio is 1 or 2, and the lock state is not detected (LOCK NG). Therefore, the optimum frequency range does not exist, which indicates error. According to the first exemplary embodiment, the error can be found even in such a case.

FIG. 5B shows the case that the output frequency is F4 to F2. In this case, the control current Ic of the CCO 105 belongs to the current range 2 when the dividing ratio is 1, and the lock state is detected (LOCK OK). On the other hand, the control current Ic of the CCO 105 belongs to the current range 3 when the dividing ratio is 2, and the lock state is not detected (LOCK NG). Therefore, the optimum frequency range is the HIGH range in which the dividing ratio is 1.

Figure 5D:
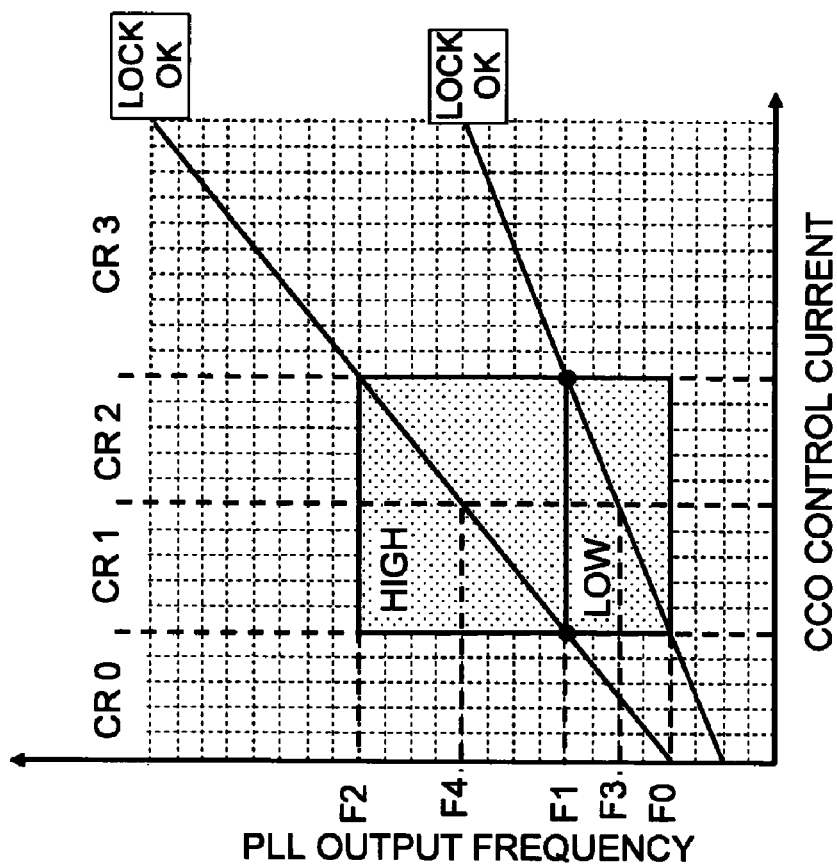
Figure 5C:
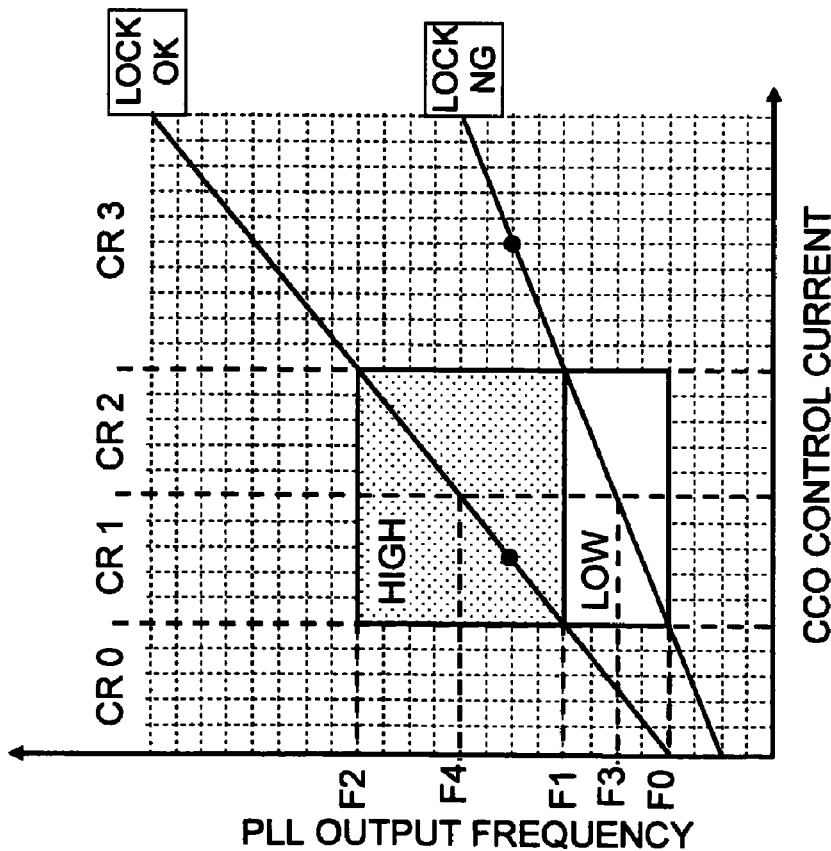

FIG. 5C shows the case that the output frequency is F1 to F4. In this case, the control current Ic of the CCO 105 belongs to the current range 1 when the dividing ratio is 1, and the lock state is detected (LOCK OK). On the other hand, the control current Ic of the CCO 105 belongs to the current range 3 when the dividing ratio is 2, and the lock state is not detected (LOCK NG). Therefore, the optimum frequency range is the HIGH range in which the dividing ratio is 1.

FIG. 5D shows the case that the output frequency is F1. In this case, the control current Ic of the CCO 105 belongs to the current range 0 or the current range 1 when the dividing ratio is 1, and the lock state is detected (LOCK OK). On the other hand, the control current Ic of the CCO 105 belongs to the current range 2 or the current range 3 when the dividing ratio is 2, and the lock state is detected (LOCK OK). Therefore, the optimum frequency range is the HIGH range in which the dividing ratio is 1 or the LOW range in which the dividing ratio is 2. In such a case, priority is predetermined and one of the two ranges is selected.

Figure 5F:
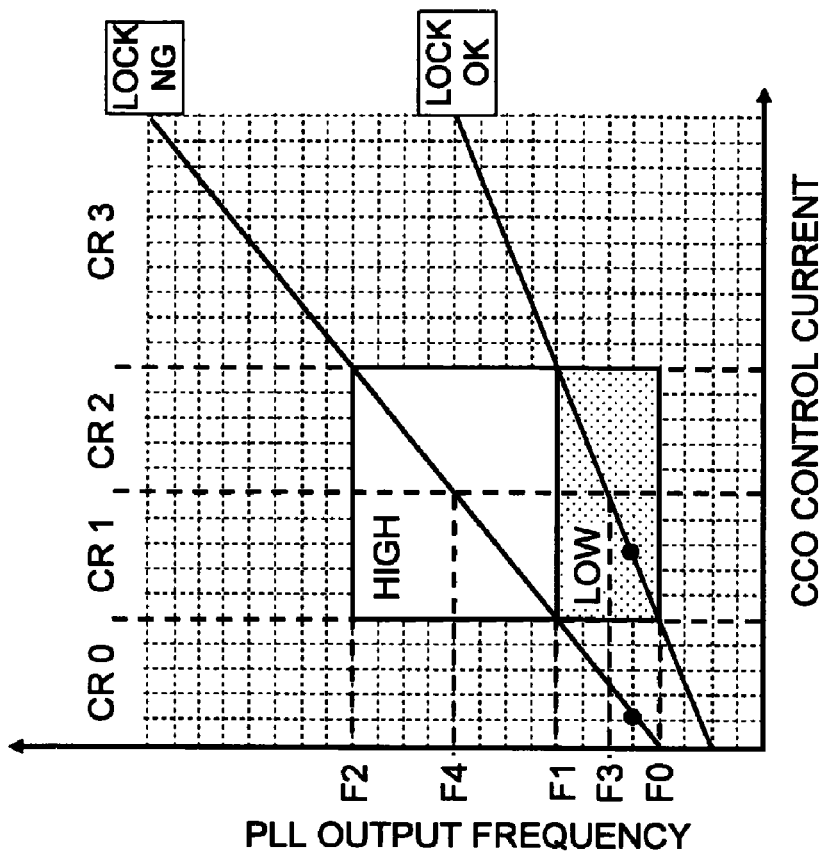
Figure 5E:
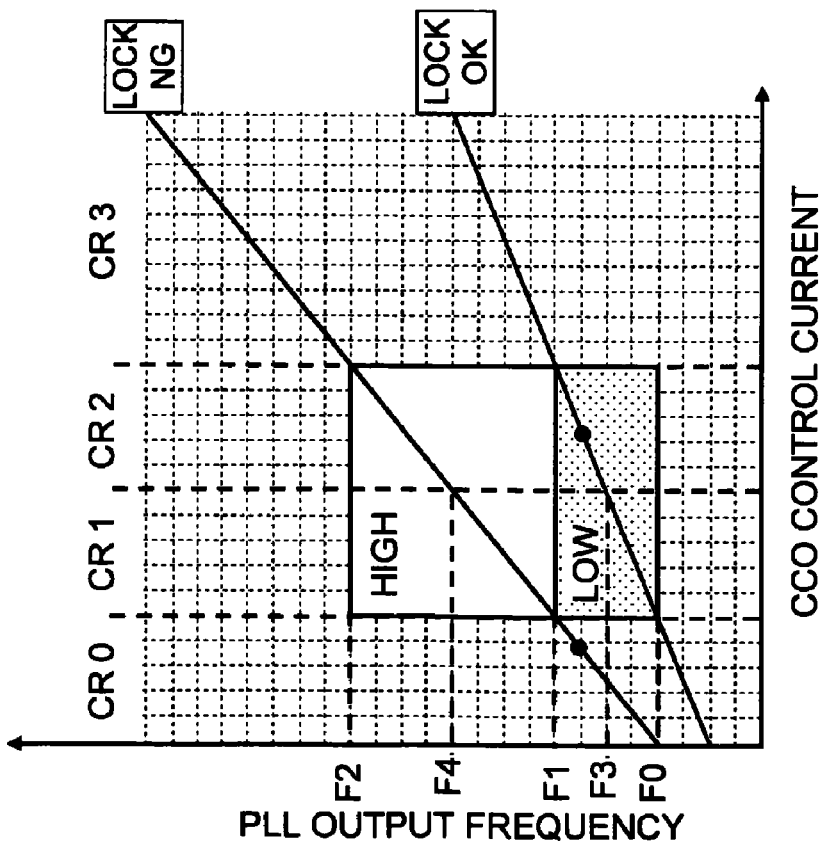

FIG. 5E shows the case that the output frequency is F3 to F1. In this case, the control current Ic of the CCO 105 belongs to the current range 0 when the dividing ratio is 1, and the lock state is not detected (LOCK NG). On the other hand, the control current Ic of the CCO 105 belongs to the current range 2 when the dividing ratio is 2, and the lock state is detected (LOCK OK). Therefore, the optimum frequency range is the LOW range in which the dividing ratio is 2.

FIG. 5F shows the case that the output frequency is F0 to F3. In this case, the control current Ic of the CCO 105 belongs to the current range 0 when the dividing ratio is 1, and the lock state is not detected (LOCK NG). On the other hand, the control current Ic of the CCO 105 belongs to the current range 1 when the dividing ratio is 2, and the lock state is detected (LOCK OK). Therefore, the optimum frequency range is the LOW range in which the dividing ratio is 2.

Figure 5G:
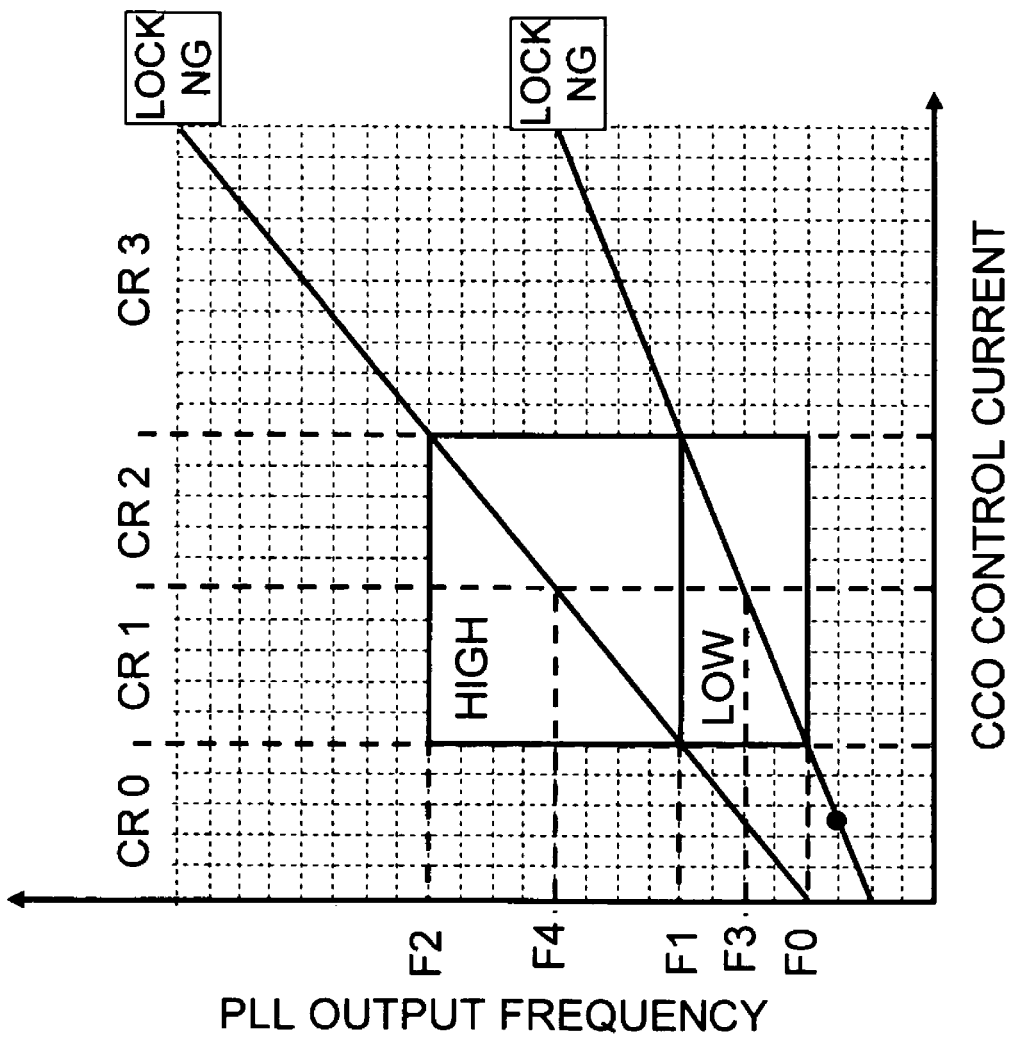

FIG. 5G shows the case that the output frequency is lower than F0. In this case, the control current Ic of the CCO 105 belongs to the current range 0 regardless of whether the dividing ratio is 1 or 2, and the lock state is not detected (LOCK NG). Therefore, the optimum frequency range does not exist, which indicates error. According to the first exemplary embodiment, the error can be found even in such a case.

In the Table 1, the results of lock detection and the current range shown in FIGS. 5A to 5G are shown.

TABLE 1

| Output Frequency | Dividing Ratio 1 | | Dividing Ratio 2 | | Optimum Dividing Ratio |
|---|---|---|---|---|---|
| | Current Range | Lock Detection | Current Range | Lock Detection | |
| F2< | 3 | 0 | 3 | 0 | None (Error) |
| F4-F2 | 2 | 1 | 3 | 0 | 1 |
| F1-F4 | 1 | 1 | 3 | 0 | 1 |
| F1 | 1 or 0 | 1 | 3 or 2 | 1 | 1 or 2 |
| F3-F1 | 0 | 0 | 2 | 1 | 2 |
| F0-F3 | 0 | 0 | 1 | 1 | 2 |
| <F0 | 0 | 0 | 0 | 0 | None (Error) |

In the first exemplary embodiment, the frequency of the output signal (the output frequency) can be accurately known by detecting the control current that controls the CCO 105. Therefore, the frequency range of the output signal can be accurately switched. By switching the output frequency range, the output frequency range can be extended by adding the LOW range to the HIGH range as shown in FIG. 4.

Further, the control current is used instead of the control voltage. Thus it is easy to correct error by adding the offset current.

Furthermore, the optimum frequency range can be determined in a short period of time by combination with the lock detection. Here, the error with which the lock state cannot be detected at any frequency ratio can be detected.

Additionally, by adding the offset current to the control current and detecting the lock state, the optimum frequency range can be determined more accurately. Thus, better PLL property can be obtained within the selected optimum frequency range.

Second Exemplary Embodiment

Figure 6:
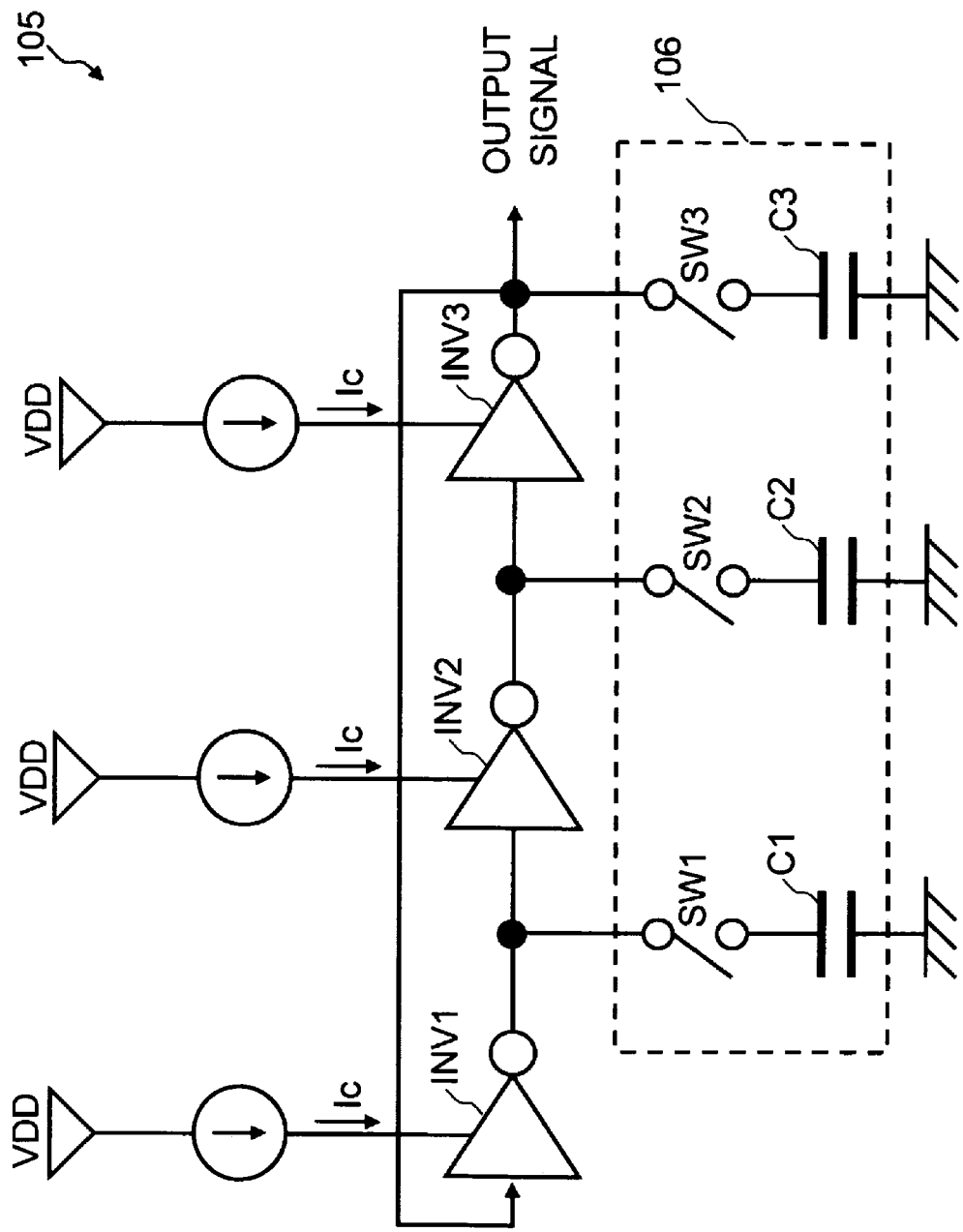
FIG. 6 is a circuit diagram showing a current controlled oscillator 105 according to a second exemplary embodiment of the present invention.
Figure 7:
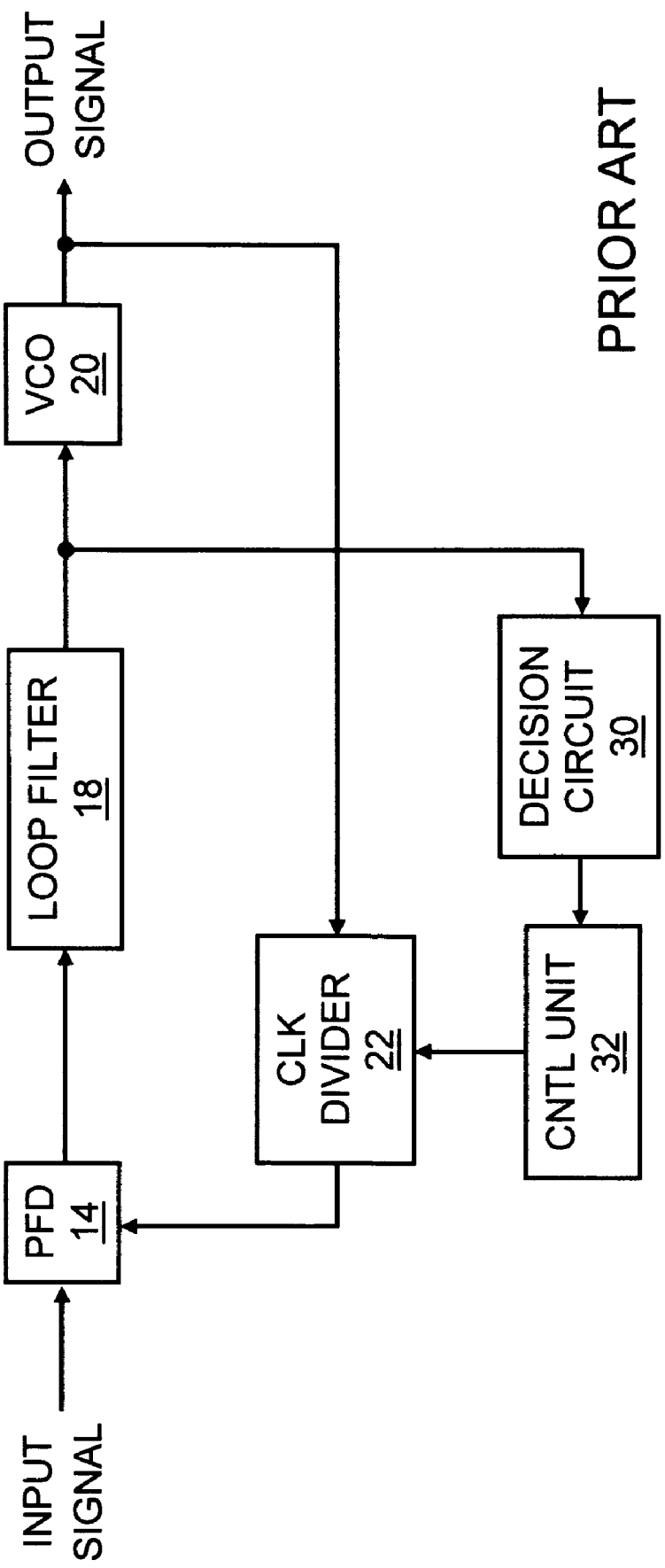
FIG. 7 corresponds to FIG. 1 of International Patent Publication No. WO 99/19987.

Next, another exemplary embodiment of the present invention will be described. The FRS 106 in the CCO 105 of the second exemplary embodiment is different from that of the first exemplary embodiment. The other components are similar to those of the first exemplary embodiment. FIG. 6 is a circuit diagram showing the current controlled oscillator 105 in the PLL circuit according to the second exemplary embodiment. The FRS 106 is composed of a plurality of capacitors and switches in the second exemplary embodiment while the FRS 106 is a frequency divider in the first exemplary embodiment.

The oscillator in the CCO 105 is the ring oscillator. In FIG. 6, the ring oscillator includes three inverters INV 1 to INV 3. Each inverter transmits a pulse signal with delay according to the control current Ic. In other words, the output frequency is controlled by the control current Ic. Here, an inverter is one example of a delay element. Thus other delay elements can be used. Further, the number of inverters which is three is for purposes of illustration and not limitation.

In the second exemplary embodiment, one end of a capacitor C1 is connected to the node between the inverters INV1 and INV2 through a switch SW1. The other end of the capacitor C1 is connected to ground. In the same way, one end of a capacitor C2 is connected to the node between the inverters INV2 and INV3 through a switch SW2. The other end of the capacitor C2 is connected to ground. In the same way, one end of a capacitor C3 is connected to the node between the inverters INV3 and INV1 through a switch SW3. The other end of the capacitor C3 is connected to ground. Capacitance values of capacitors C1 to C3 may either be the same or different. The FRS 106 is composed of switches SW1 to SW3 and capacitors C1 to C3.

Here, the output frequency range can be switched by changing the number of capacitors connected to the oscillator. Specifically, when no capacitor is connected to the oscillator, the frequency is the highest. The frequency range becomes lower by adding the number of capacitors connected to the oscillator. Compared with the divider in the first exemplary embodiment, it is easy to obtain a fractional dividing ratio. Further, the frequency divider in the first exemplary embodiment can be combined with capacitors in the second exemplary embodiment. As described above, under the condition that only a standard signal with unknown frequency is input, the output frequency can be accurately known by detecting the control current that controls the CCO 105 in the above exemplary embodiments. The reason is that the control current is not influenced by manufacturing conditions and operating temperature environment of the VIC. Therefore, the frequency range of the output pulse signal can be accurately switched. By switching the output frequency, the output frequency range can be extended by adding the LOW range to the HIGH range as shown in FIG. 4.

Further, the control current is used instead of the control voltage. Thus it is easier to correct error by adding the offset current than to correct error by using the control voltage.

Furthermore, the optimum frequency range can be determined in a short period of time by combination with the lock detection. Here, the error with which the lock state cannot be detected at any frequency ratio can be detected. Additionally, by adding the offset current to the control current and detecting the lock state, the optimum frequency range can be determined more accurately. Thus, better PLL property can be obtained within the selected optimum frequency range.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A phase-locked loop circuit comprising:
   a voltage-current converter that converts a control voltage into a control current, the control voltage generated according to a phase difference between an input pulse signal and a feedback pulse signal fed back from an output side of a current controlled oscillator;
   the current controlled oscillator that generates an output pulse signal having a frequency according to the control current;
   a current detection unit that detects the control current;
   a frequency range switch that switches a frequency range of the output pulse signal according to the detected control current; and
   a lock detection circuit that detects a lock state in which the output pulse signal is locked to the input pulse signal,
   wherein the frequency range switch switches the frequency range of the output pulse signal according to the detected control current and a detection result of the detection circuit.

2. The phase-locked loop circuit according to claim 1, wherein the frequency range switch comprises a frequency divider that determines a dividing ratio based on the detected control current.

3. A phase-locked loop circuit comprising:
   a voltage-current converter that converts a control voltage into a control current, the control voltage generated according to a phase difference between an input pulse signal and a feedback pulse signal fed back from an output side of a current controlled oscillator;
   the current controlled oscillator that generates an output pulse signal having a frequency according to the control current;
   a current detection unit that detects the control current; and
   a frequency range switch that switches a frequency range of the output pulse signal according to the detected control current,
   wherein the frequency range switch comprises one or a plurality of capacitors, each of the capacitors connected to an inverter in the current controlled oscillator through a switch.

4. The phase-locked loop circuit according to claim 3, further comprising a lock detection circuit that detects a lock state in which the output pulse signal is locked to the input pulse signal,
   wherein switching of the switch is controlled according to the detected control current and a detection result of the lock detection circuit.

5. The phase-locked loop circuit according to claim 1, wherein a frequency of the input pulse signal is unknown.

6. The phase-locked loop circuit according to claim 1, wherein the voltage-current converter and the current controlled oscillator constitute a voltage controlled oscillator.

7. The phase-locked loop circuit according to claim 1, further comprising an offset current generation circuit that generates an offset current,
   wherein the current controlled oscillator generates the output pulse signal having the frequency according to the control current to which the offset current is added.

8. The phase-locked loop circuit according to claim 3, wherein the voltage-current converter and the current controlled oscillator constitute a voltage controlled oscillator.

9. The phase-locked loop circuit according to claim 3, further comprising an offset current generation circuit that generates an offset current,
   wherein the current controlled oscillator generates the output pulse signal having the frequency according to the control current to which the offset current is added.

* * * * *